United States Patent [19]

Engle et al.

[11] Patent Number: 4,610,748

[45] Date of Patent: Sep. 9, 1986

[54] APPARATUS FOR PROCESSING SEMICONDUCTOR WAFERS OR THE LIKE

[75] Inventors: George M. Engle, Scottsdale; Richard S. Rosler, Paradise Valley, both of Ariz.

[73] Assignee: Advanced Semiconductor Materials of America, Inc., Phoenix, Ariz.

[21] Appl. No.: 679,898

[22] Filed: Dec. 10, 1984

[51] Int. Cl.⁴ ............................ B44C 1/22; C23F 1/00; C23C 14/00; B05B 5/02
[52] U.S. Cl. .................................... 156/345; 118/50.1; 118/620; 118/728; 156/643; 156/646; 204/298
[58] Field of Search ......................... 156/345, 643, 646; 204/192 EC, 192 E, 298; 118/728, 50.1, 620; 427/38, 39

[56] References Cited

U.S. PATENT DOCUMENTS

| | | | |
|---|---|---|---|
| 4,178,877 | 12/1979 | Kudo | 156/646 X |
| 4,222,839 | 9/1980 | Goodner | 156/345 X |
| 4,233,109 | 11/1980 | Nishizawa | 156/345 X |
| 4,424,096 | 1/1984 | Kumagai | 156/345 X |

*Primary Examiner*—William A. Powell
*Attorney, Agent, or Firm*—Harry M. Weiss & Associates

[57] ABSTRACT

A disk boat assembly for holding workpieces to be processed within a chemical reaction processing apparatus during the chemical vapor process. The boat assembly includes a pair of electrically conductive rail members held rigidly and radially apart between two dielectric end holding members that electrically isolate the two rail members. A plurality of disk like plates are connected respectively to the two rail members and are interleaved such that adjacent disk plates are electrically isolated. Each disk plate includes pairs of bores formed therein with each pair extending radially outward from the center of the disk. Insertable pins are placed in a respective pair of bores, the distance therebetween of which can be extended by insertion in an additional pair of bores lying further from the center of the disk so that variable diameter workpieces can be held on the broad surfaces of each disk plate.

4 Claims, 6 Drawing Figures

APPARATUS FOR PROCESSING SEMICONDUCTOR WAFERS OR THE LIKE

BACKGROUND OF THE INVENTION

The present invention relates to processing of semiconductor wafers and, more particularly, to a boat assembly used to hold semiconductor wafers or the like within externally excited, chemical reaction systems wherein the reactant flows over the wafers or workpieces that are held with their broad surfaces in perpendicular to the flow of the reactant.

Plasma enhanced chemical vapor reactors are known in the art wherein the plasma reactant gas or gasses flow across serially arranged workpieces perpendicular to the broad surfaces of the workpieces. For instance, U.S. Pat. No. 4,401,507, which is incorporated herein by reference made thereto, is exemplary of the type of plasma chemical vapor reactor to which the present invention is applicable. The chemical reactor systems of the type disclosed in the U.S. Pat. No. 4,401,507, utilize an evacuable tabular envelope retained in a furnace. A boat assembly that is removably inserted into the tabular envelope is used to hold workpieces perpendicular to the flow of the gas reactants that are passed through the tabular envelope during the depositing process of the workpieces. Of great concern in these chemical vapor reactor systems is the degree of process uniformities achievable. It is desirable to maintain the deposit thickness of film properties of the workpieces processed in the chemical reactors to maximum of ±5% from one end of the loaded boat assembly to the other. In addition, it is desirable to be able to process as many workpieces as possible during each chemical vapor deposition process.

Thus a need exists for an improved apparatus which can be utilized in contemporary plasma enhanced chemical vapor deposition reactors that can maintain the process uniformities below ±5% while allowing a larger number of workpieces to be processed at one time than is presently possible with conventional boat assemblies presently available.

SUMMARY OF THE INVENTION

Accordingly, it is an object of the present invention to provide an improved boat apparatus for use in the processing of workpieces.

It is another object of this invention to provide an apparatus for improved uniformity in an externally excited chemical reaction process.

Yet another object of this invention is to provide an apparatus for improved uniformity of etch rate, etch profile and selectively in an externally excited chemical reaction process.

Still another object of this invention is to provide an apparatus for permitting higher deposition rate using less peak power in an externally excited chemical reaction process.

A further object of this invention is to provide a boat assembly for use in a chemical reaction process which allows a large number of workpieces to be processed in a chemical reaction process with improved process uniformities.

It is still a further object of this invention to provide a disk boat assembly for holding a large number of semiconductor wafers with their broad surfaces perpendicular to the flow of a reactant during processing in a chemical reaction process such that improved process components, higher deposition rates and the use of less peak power are achieved.

In accordance with the above and other objects, there is disclosed a boat assembly comprising holding ends which rigidly support a pair of conductive rails therebetween, each rail having a plurality of interleaved disk plate assemblies held thereto with each rail being electrically isolated from the other and the disk plate assemblies having adjustable holding assemblies for holding workpieces.

A feature of the invention is that different circumference workpieces can be held on opposite surfaces of the disk plate assemblies each with its broad surface being perpendicular to the flow of a gaseous reactant when the boat assembly is removably inserted in an externally excited chemical reaction processing apparatus with each of the rails being executed by an alternating RF power source.

The features and advantages of the present invention will be apparent from the following description of the preferred embodiment as illustrated in the accompanying drawings.

DETAILED DESCRIPTION OF THE INVENTION

Figure 1:
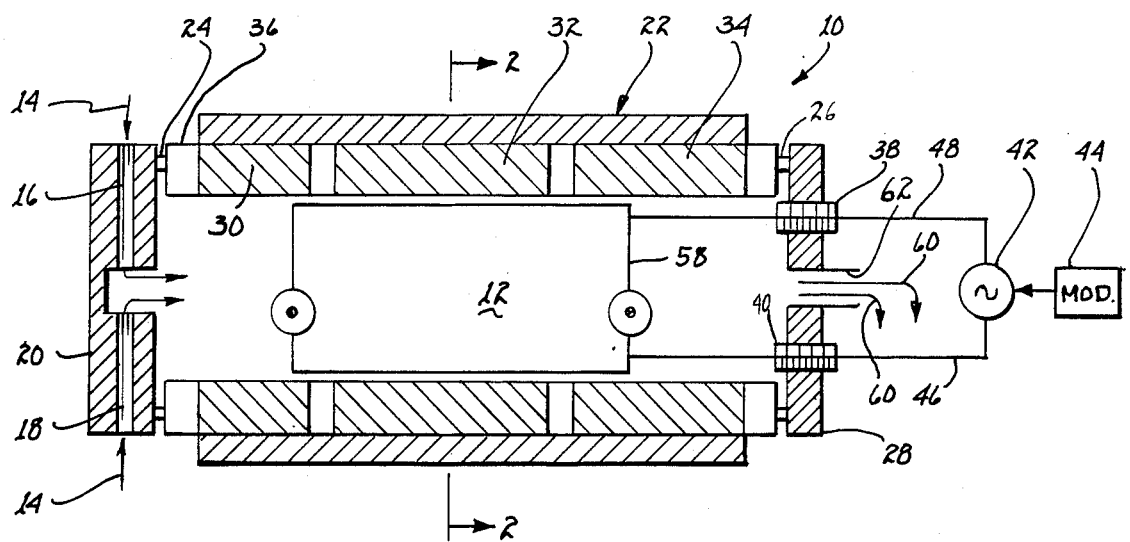
FIG. 1 is a partial schematic and block diagram longitudinal sectional view of a plasma enhanced reaction system including the assembly of the present invention.

Referring to FIG. 1 there is shown a plasma enhanced chemical vapor processing apparatus 10 of the type and operation that is fully described in U.S. Pat. No. 4,401,507 issued to George Engle on Aug. 30, 1983. Apparatus 10 has not been completely illustrated as its structure and operation is well known to those in the art, for instance, the aforementioned U.S. Pat. No. 4,401,507 patent illustrates and describes apparatus 10 in detail. Apparatus 10 may be but one of a variety of continuous or pulsed RF plasma enhanced, or other chemical processing systems to which the inventive disk boat assembly 12 is applied.

A general description of the operation of the processing system exemplified by FIG. 1 is as follows:

A reactant or plurality of reactants designated by arrows 14 that are regulated by flow controller pass through tubing (not shown) into passages 16 and 18 of closing end cap 20 of furnace assembly 22 of processing apparatus 10. Furnace assembly 22 comprises O-rings 24 and 26 respectively to provide a gas-tight seal between end caps 20 and 28, and a three segment heating element 30, 32, and 34 surrounding tube element 36. In the example of FIG. 1, RF excitation power enters the chamber of tube 36 through insulators 38 and 40 in end cap 28.

Workpieces or semiconductor wafers (not shown) that are to be processed are disposed in disk boat assembly 12. Disk boat assembly 12 receives the alternating RF power from source 42 that is modulated by modulator 44 across electrodes 46 and 48. As will be explained, electrodes 46 and 48 are attached to one end of disk boat assembly to first and second electrically isolated rail members 50 and 52 (FIGS. 2-5) between which the workpieces 54 (FIGS. 2 and 4) are disposed. It is noted that the end holding means 56 forming end 58 of disk boat assembly 12 and to which electrodes 46 and 48 are attached resides exterior to the plasma field of processing apparatus 10. In the aforedescribed or any other configuration, the gas flow is such that the gas passes over or around workpieces 54 in a certain sequence or order and exits as illustrated by arrows 60 through outlet 62 as understood. The described system operates below atmospheric pressure by evacuating tube 36.

Figure 2:
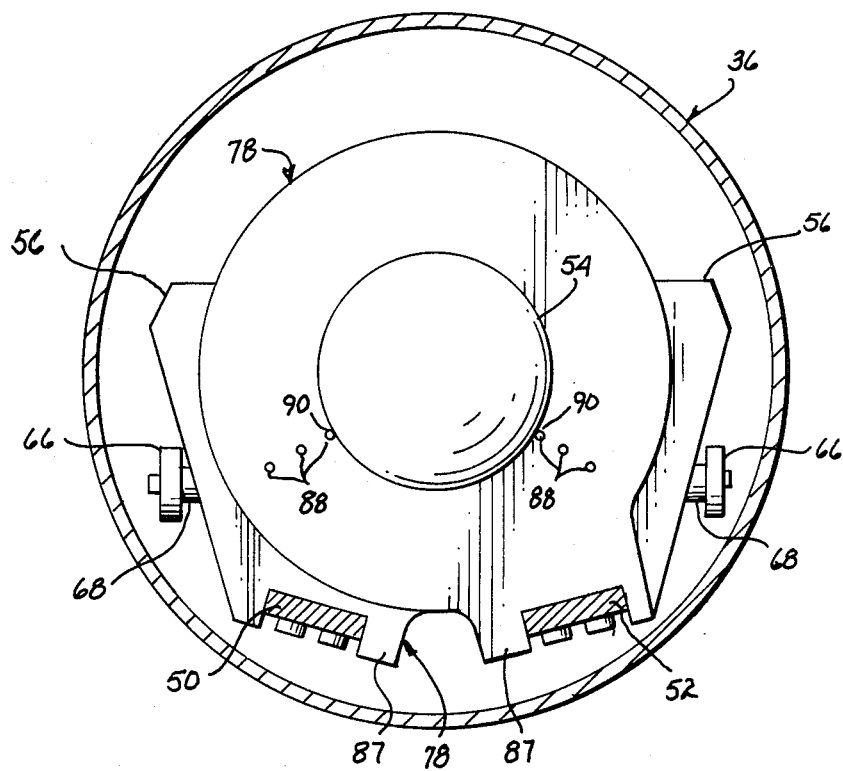
FIG. 2 is a cross-sectional transverse view of the structure of FIG. 1 taken along the direction of arrows 2—2.
Figure 3:
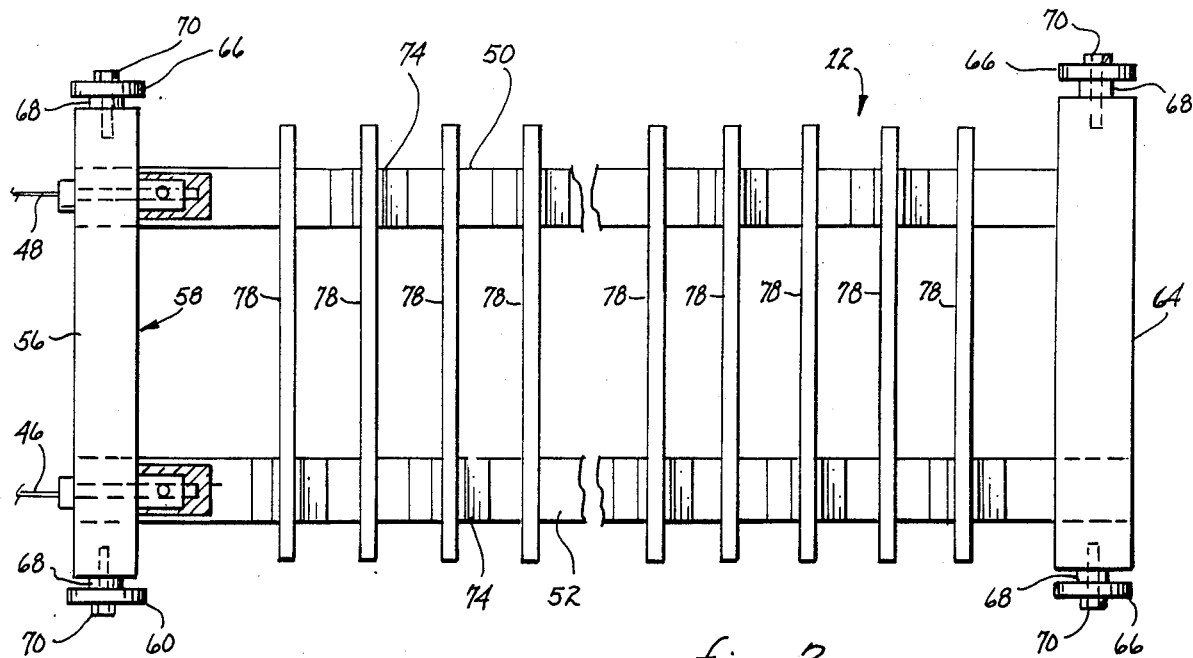
FIG. 3 is a top plan view in fragmentory of the boat assembly illustrated in FIG. 1.
Figure 4:
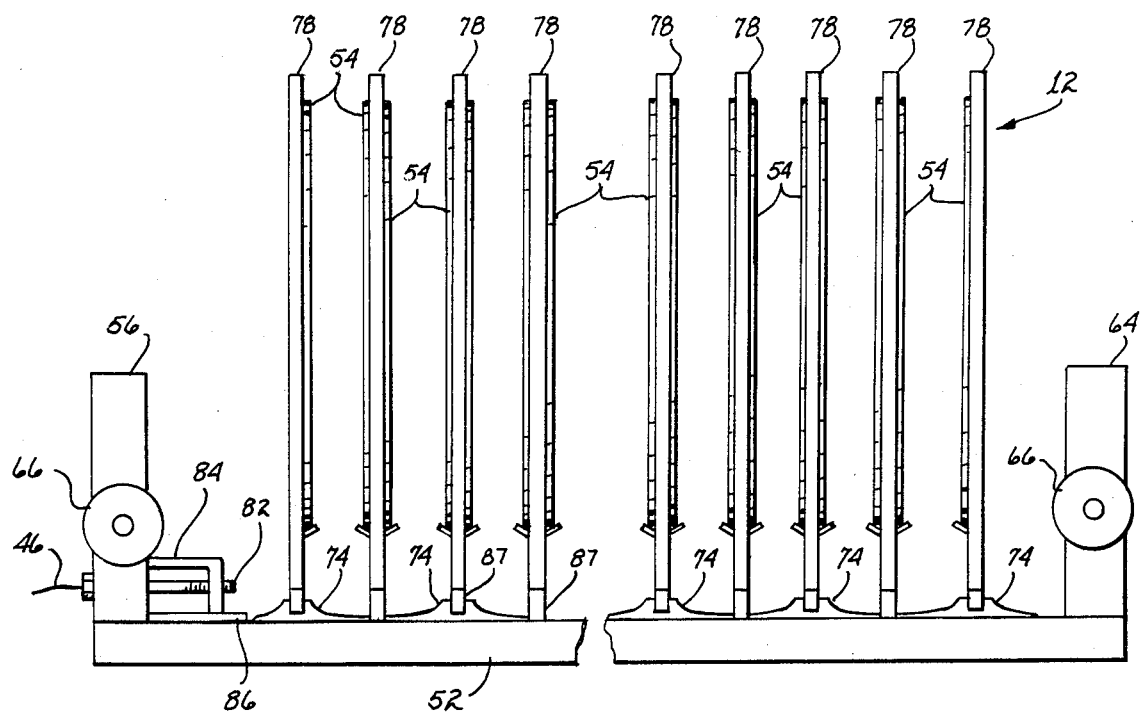
FIG. 4 is a side elevational view of the boat assembly of FIG. 3.
Figure 5:
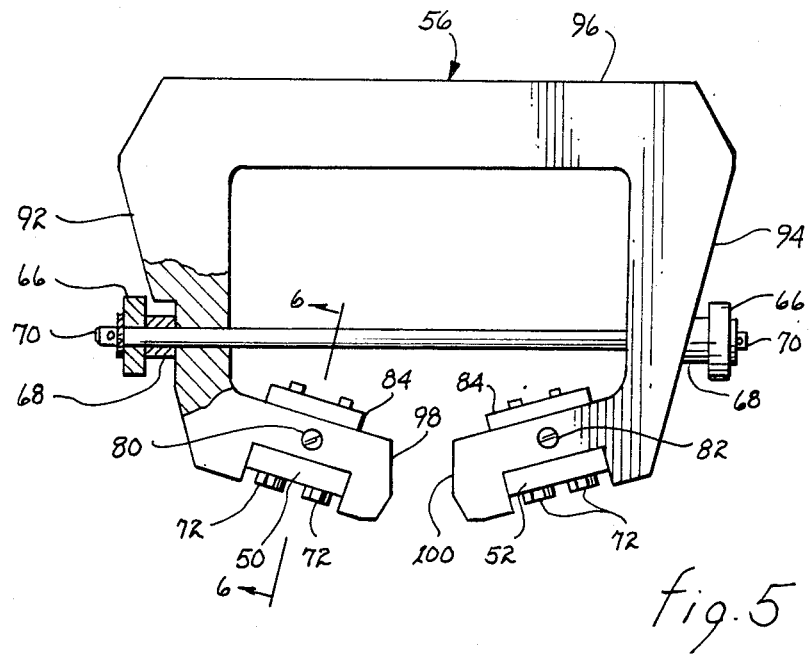
FIG. 5 is a plan end view of the one end of the boat assembly of FIG. 3.

Turning now to FIGS. 2-4, disk boat assembly 12 of the invention is described in detail. As shown, disk boat assembly 12 includes a pair of end members including end holding means 56 and 64 between which electrically conducting rails 50 and 52 are rigidly held. Each end member 56 and 64 has a pair of wheels 66 axially mounted thereto through bearing means 68 and shafts 70. Wheels 66, which may be fabricated from ceramic for example, ride on the inside of tube 36 to allow disk boat assembly 12 to be readily inserted and removed from processing apparatus 10 during processing of workpieces 54. End members 56 and 64 may also be fabricated for ceramic such that conductive rails 50 and 52 are electrically isolated from one another. Each rail 50 and 52, is attached to a negative end member, as shown in FIG. 5, by screw attaching members 72. Each rail 50 and 52 includes a plurality of conductive boss members 74 attached thereto with each boss member having a groove 76 formed therein into which interleaved disk plate members 78 are respectively disposed. As illustrated, each alternating disk plate assembly 78 is attached to a respective boss member 74 such that alternate ones are attached to the same rail 50 and 52 with adjacent disk plate assemblies 74 being electrically isolated. Each disk plate assembly 74 may be fabricated from any suitable conductive material such as graphite, for example, and is electrically coupled to its respective rail 50 or 52. Electrical connection from electrodes 46 and 48 are made directly to the rails 50 and 52.

Each disk plate member 78 is, as named, fabricated in the form of a disk, the outer circumference of which conforms with the inner circumference of tube 36 and is spaced therefrom by a predetermined distance to permit the gas reactant to flow uniformly through tube 36 and over each workpiece held to the surfaces of the disk plate assembly. The circumference of each individual disk plate assembly 78 alternates in tongue appendage 87 that fits within the groove of a respective boss member 74. As illustrated, each disk plate assembly has respective pairs of openings of bores 88 extending radially thereabout in the broad surface thereof which can receive holding pin member 90. During processing, wafers or workpieces 54 are held against the surfaces of disk plate assemblies by resting between respective pairs of pins 90 such that their surfaces are perpendicular to the flow of the gas reactant. Workpieces 54 can therefore by mounted to the opposing surfaces of each disk plate assembly 78. An advantage of the disk plate assembly 78 is that by removing pins and inserting them in different pairs of openings, different size wafers can be processing using single disk boat 12. For instance, disk boat assembly 12 can be used to process 3 inch, 100 mm, 125 mm and 150 mm workpieces in a conventional 200 mm diameter tube 36. In addition, very uniform spacing can be maintained between each disk plate assembly 78 and, hence, between the broad surfaces of the workpieces assembled in disk boat assembly 12. This permits between process uniformities to be achieved over prior art of boat assemblies. For example, disk boat assembly 12 has provided process uniformities in the range of 3-5% whereas prior art boat assemblies typically can provide process uniformities of a minimum of $\pm 5\%$. Disk boat assembly 12 also permits higher deposition rates utilizing lower peak-power than prior art systems. Moreover, the higher deposition rates, 600 Å/minute, capable with the disk boat assembly 12 are compared to 250 Å/minute for prior art assemblies, increases the throughput of the system as well as increased die yield per wafer.

Figure 6:
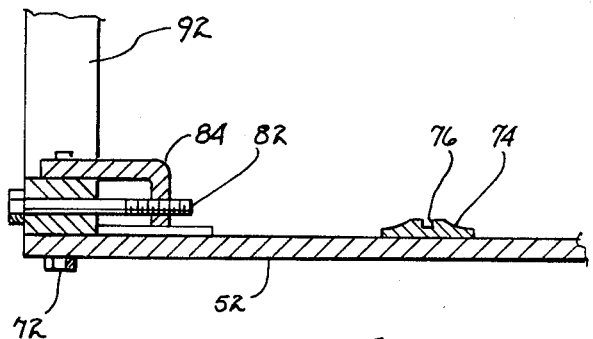
FIG. 6 is a cross-sectional view of the portion of the end of the boat assembly of FIG. 4 taken in the direction of arrows 6—6.

Turning to FIGS. 5 and 6 each end member such as end member 56 is shown as comprising side members 92 and 94 terminates in an end protrusion arm 98 and 100 which are formed at respective angles such that rails 50 and 52 are radially spaced with respect to each other within slotted grooves receive alternate ones of interleaved disk plate assemblies 78.

Hence what has been described in a novel disk boat assembly that can be utilized in a chemical reaction processing apparatus which increases process uniformities obtained on workpieces held thereby an attending advantage of inventive disk boat assembly is that more work pieces are held within the chemical reaction process apparatus than be held in most, if not all, present boat assemblies being utilized.

If desired, either electrically conductive depositions such as an aluminum-type metal and refractory metals and their silicides such as tungsten or titanium silicide can be be deposited using the subject apparatus which can also be used, if desired, to deposit insulating films.

What is claimed is:

1. In a chemical vapor processing apparatus for processing workpices within an evacuable envelope for containing the chemical vapor and workpieces, a boat assembly removably insertable within the envelope, comprising:

a plurality of electrically conductive disk plate members, and disk plate members being interleaved with respect to each other;

holding means for rigidly holding said interleaved disk plate members and electrically isolating adjacent ones of said disk plate members;

conductor means for applying an alternating energy to said disk plate members when energized; and variably holding means for holding variable size workpieces onto each of said disk plate members.

2. The processing apparatus of claim 1 wherein said boat assembly further comprises a pair of rail members each having a plurality of boss members spaced linearily apart, each of said boss members holding a respective one of said plurality of disk plate members in electrical contact therewith, each rail member receiving said alternating energy through said conductor means.

3. The processing apparatus of claim 2 wherein said holding means further comprises:

a pair of end members each including end protrusion members having a slot formed therein that is spaced in a radial manner from the envelope, said holding means being fabricated of a dielectric material and extending outward of the active chemical vapor reaction region of the processing apparatus;

a respective one of said rails being disposed within a respective one of said grooves formed in said holding means; and said conductor means including a pair of electrodes coupled to a respective rail member through said holding means.

4. The processing of claim 3 wherein said variable holding means includes:

a plurality of respective pairs of bores formed in opposing surfaces of each disk plate member and extending radially outward from the center of each disk plate member; and a pair of pins removably insertable within a respective pair of said bores such that individual workpieces are held between said pair of pins.

* * * * *